(12) United States Patent
Lee et al.

(10) Patent No.: US 12,733,180 B2
(45) Date of Patent: Sep. 8, 2026

(54) SEMICONDUCTOR DEVICE AND METHOD FOR FORMING THE SAME

(71) Applicant: MACRONIX INTERNATIONAL CO., LTD., Hsinchu (TW)

(72) Inventors: Dai-Ying Lee, Hsinchu County (TW); Cheng-Hsien Lu, Taoyuan City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 700 days.

(21) Appl. No.: 18/178,580

(22) Filed: Mar. 6, 2023

(65) Prior Publication Data

US 2024/0304579 A1 Sep. 12, 2024

(51) Int. Cl.
*H10B 80/00* (2026.01)
*H10W 72/00* (2026.01)
(Continued)

(52) U.S. Cl.
CPC .......... *H10B 80/00* (2023.02); *H10W 90/751* (2026.01); *H10W 72/019* (2026.01);
(Continued)

(58) Field of Classification Search
CPC ......... H01L 24/08; H01L 24/03; H01L 24/48; H01L 24/80; H01L 2924/1438; H01L 2924/1443; H01L 2224/03848; H01L 2224/05649; H01L 2224/05657; H01L 2224/05666; H01L 2224/05671; H01L 2224/0568; H01L 2224/05681; H01L 2224/05687; H01L 2224/08112; H01L 2224/08146; H01L 2224/48221; H01L 2224/80895; H01L 2224/80896;
(Continued)

(56) References Cited

U.S. PATENT DOCUMENTS

| | | | |
|---|---|---|---|
| 7,897,431 | B2 | 3/2011 | Chen et al. |
| 10,068,879 | B2 | 9/2018 | Gowda |

(Continued)

FOREIGN PATENT DOCUMENTS

| | | | |
|---|---|---|---|
| CN | 112435991 | A | 3/2021 |
| JP | 2002134685 | A | 5/2002 |

(Continued)

OTHER PUBLICATIONS

KIPO Office Action dated Jul. 11, 2024 in KR Application No. 10-2023-0060571.

(Continued)

*Primary Examiner* — Timor Karimy
(74) *Attorney, Agent, or Firm* — McClure, Qualey & Rodack, LLP

(57) ABSTRACT

Semiconductor devices and a method for forming a semiconductor device are provided. The semiconductor device includes a substrate, a first semiconductor structure on the substrate, a second semiconductor structure on the first semiconductor structure, and a wire coupled between the substrate and the first semiconductor structure. The first semiconductor structure and the second semiconductor structure are electrically connected to the substrate through the wire. A footprint of the first semiconductor structure is greater than a footprint of the second semiconductor structure.

9 Claims, 14 Drawing Sheets

(51) Int. Cl.

| | |
|---|---|
| ***H10W 72/90*** | (2026.01) |
| ***H10W 90/00*** | (2026.01) |
| *H10W 80/00* | (2026.01) |

(52) U.S. Cl.

CPC ...... *H10W 72/9415* (2026.01); *H10W 72/952* (2026.01); *H10W 72/953* (2026.01); *H10W 80/312* (2026.01); *H10W 80/327* (2026.01); *H10W 80/743* (2026.01); *H10W 90/792* (2026.01)

(58) Field of Classification Search

CPC .. H10B 80/00; H10W 72/952; H10W 72/953; H10W 72/019; H10W 72/9415; H10W 80/312; H10W 80/743; H10W 80/327; H10W 90/792; H10W 90/751

See application file for complete search history.

(56) References Cited

U.S. PATENT DOCUMENTS

| | | | | |
|---|---|---|---|---|
| 10,727,204 | B2 | 7/2020 | Agarwal et al. | |
| 11,502,162 | B2 | 11/2022 | Ogino et al. | |
| 2021/0366855 | A1 | 11/2021 | Okina | |
| 2022/0367391 | A1* | 11/2022 | Wei | H01L 24/06 |
| 2023/0005881 | A1* | 1/2023 | Poddar | H01L 23/49822 |

FOREIGN PATENT DOCUMENTS

| | | | |
|---|---|---|---|
| JP | 2021093397 | A | 6/2021 |
| KR | 20180031576 | A | 3/2018 |
| KR | 20210003923 | A | 1/2021 |
| TW | I236744 | B | 7/2005 |
| TW | 200935578 | A | 8/2009 |
| WO | 2013153742 | A1 | 10/2013 |

OTHER PUBLICATIONS

JP Office Action dated Jul. 23, 2024 in JP application No. 2023-077192.

JP Office Action dated Dec. 3, 2024 in Japanese application No. 2023-077192.

* cited by examiner

SEMICONDUCTOR DEVICE AND METHOD FOR FORMING THE SAME

BACKGROUND

Technical Field

The present disclosure relates to a semiconductor device and a method for forming the same, and more particular to a semiconductor device involving hybrid bonding and a method for forming the same.

Description of the Related Art

In the semiconductor technology, shrinking of feature sizes, and improving operation speed, efficiency, density, and cost per Integrated circuit are important objectives. For satisfy customer need and the market demand, it is important to shrink semiconductor devices in size and also to maintain the electrical performance of semiconductor devices. For example, damage to layers and elements in semiconductor devices during the manufacturing process results in considerable negative effects upon electrical performance of semiconductor devices. As such, how to avoid damage to layers and elements in semiconductor devices has become an issue. Generally, in order to produce semiconductor devices with good electrical performance, profiles of elements in devices should be in complete shape.

SUMMARY

The present disclosure relates to semiconductor devices and methods for manufacturing the same, which can reduce or avoid damage to layers and elements in semiconductor devices, and improve electrical performance of semiconductor devices.

According to an embodiment of the present disclosure, a semiconductor device is provided. The semiconductor device includes a substrate, a first semiconductor structure on the substrate, a second semiconductor structure on the first semiconductor structure, and a wire coupled between the substrate and the first semiconductor structure. The first semiconductor structure and the second semiconductor structure are electrically connected to the substrate through the wire. A footprint of the first semiconductor structure is greater than a footprint of the second semiconductor structure.

According to another embodiment of the present disclosure, a semiconductor device is provided. The semiconductor device includes a first semiconductor structure having a first active surface, and a second semiconductor structure having a second active surface. The second active surface of the second semiconductor structure faces toward the first active surface of the first semiconductor structure. The first semiconductor structure is bonded to the second semiconductor structure. The first active surface of the first semiconductor structure includes Ti.

According to another embodiment of the present disclosure, a method for manufacturing the semiconductor element is provided. The method includes the following steps. Forming a first conductive structure on a first semiconductor layer. Forming a first bonding pad on the first conductive structure, wherein the first bonding pad is electrically connected to the first conductive structure. Forming an oxide film and a conductive portion on the first bonding pad through an annealing process, wherein the conductive portion is in the oxide film and at least partially overlaps the first bonding pad.

The above and other embodiments of the disclosure will become better understood with regard to the following detailed description of the non-limiting embodiment(s). The following description is made with reference to the accompanying drawings.

DETAILED DESCRIPTION

Figure 1:
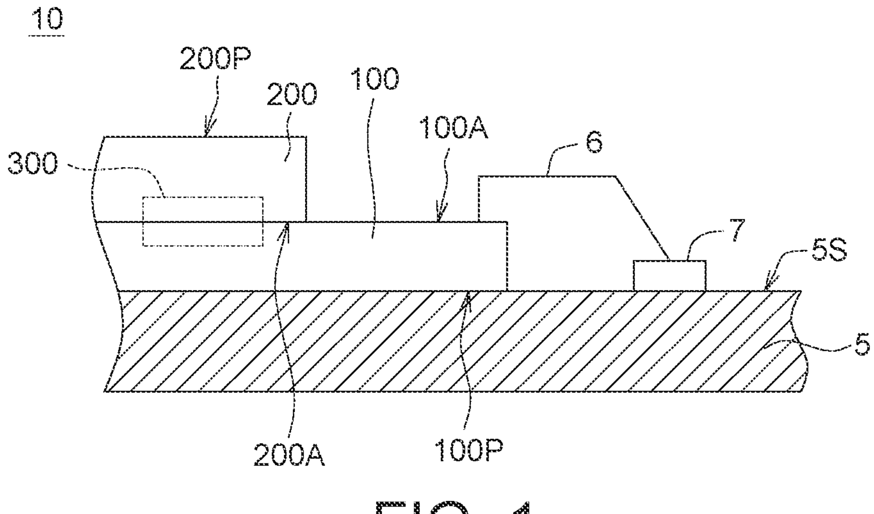
FIG. 1 illustrates a schematic view of a semiconductor device according to an embodiment of the present disclosure.

Various embodiments will be described more fully hereinafter with reference to accompanying drawings, which are provided for illustrative and explaining purposes rather than a limiting purpose. For clarity, the elements may not be drawn to scale. In addition, some elements and/or reference numerals may be omitted from some drawings. It is contemplated that the elements and features of one embodiment can be beneficially incorporated in another embodiment without further recitation.

Embodiments of the present disclosure may be applied in various types of three-dimensional stacked semiconductor devices. For example, embodiments may be applied to, but not limited to, a semiconductor device including stacked chips or a semiconductor package including stacked chips.

Referring to FIG. 1. FIG. 1 illustrates a schematic view of a semiconductor device 10 according to an embodiment of the present disclosure. The semiconductor device 10 includes a substrate 5, a semiconductor structure 100 on the substrate 5, and a semiconductor structure 200 on the semiconductor structure 100. The substrate 5 and the semiconductor structure 200 are on opposite sides of the semiconductor structure 100. The semiconductor structure 100 has a back surface 100P and an active surface 100A opposite to the back surface 100P. The semiconductor structure 200 has a back surface 200P and an active surface 200A opposite to the back surface 200P. The back surface 100P of the semiconductor structure 100 faces a substrate surface 5S of the substrate 5. The active surface 100A of the semiconductor structure 100 faces the active surface 200A of the semiconductor structure 200. The back surface 200P of the semiconductor structure 200 faces away from the semiconductor structure 100 and the substrate 5. In this embodiment, the semiconductor structure 100 is bonded to the semiconductor structure 200 in a face-to-face bonding arrangement. The semiconductor structure 100 and the semiconductor structure 200 are bonded together with a hybrid bonding technique. The hybrid bonding means that the bonding of the semiconductor structure 100 and the semiconductor structure 200 involves at least two types of bonding, such as metal-to-metal bonding and nonmetal-to-nonmetal bonding. In this embodiment, a footprint of the semiconductor structure 100 (the area occupied by the semiconductor structure 100) is greater than a footprint of the semiconductor structure 200 (the area occupied by the semiconductor structure 200). A width of the semiconductor structure 100 along a lateral direction may be greater than a width of the semiconductor structure 200 along the lateral direction.

The semiconductor device 10 includes a wire 6 coupled between the substrate 5 and the semiconductor structure 100 and a pad 7 on the substrate surface 5S of the substrate 5. The pad 7 is between the wire 6 and the substrate 5. The semiconductor structure 100 and the semiconductor structure 200 are electrically connected to the substrate 5 through the wire 6 and the pad 7. The wire 6 and the pad 7 may include conductive materials. In other embodiments, the semiconductor structure 100 can be electrically connected to the substrate 5 through other conductive connectors such as conductive bumps. The semiconductor structure 100 and the semiconductor structure 200 may be the same type of chip or different types of chips. For example, the semiconductor structure 100 and the semiconductor structure 200 may be respectively a memory chip (e.g., a dynamic random-access-memory chip or a non-volatile memory chip) or a logic chip (e.g., one or more processor cores including bus interface unit and memory access unit). In an embodiment, the semiconductor structure 100 and the semiconductor structure 200 may be electrically connected to other elements in the semiconductor device 10 through the same set of wires (e.g., wires 6 or other interconnection wires not shown), that is, the semiconductor device 10 may not include a plurality of sets of wires respectively electrically connecting the semiconductor structure 100 and the semiconductor structure 200 to other elements; with such configuration, the area occupied by wires can be reduced, the packing density can be increased, and the size or height of the semiconductor device can be reduced. In an embodiment, the footprint of the semiconductor structure 100 is greater than a footprint of the semiconductor structure 200 so as to reserve spaces for arranging wires (such as the wire 6) on the semiconductor structure 100, but the present disclosure is not limited thereto. In other embodiment, the wires can be arranged on the semiconductor structure 200.

Figure 2A:
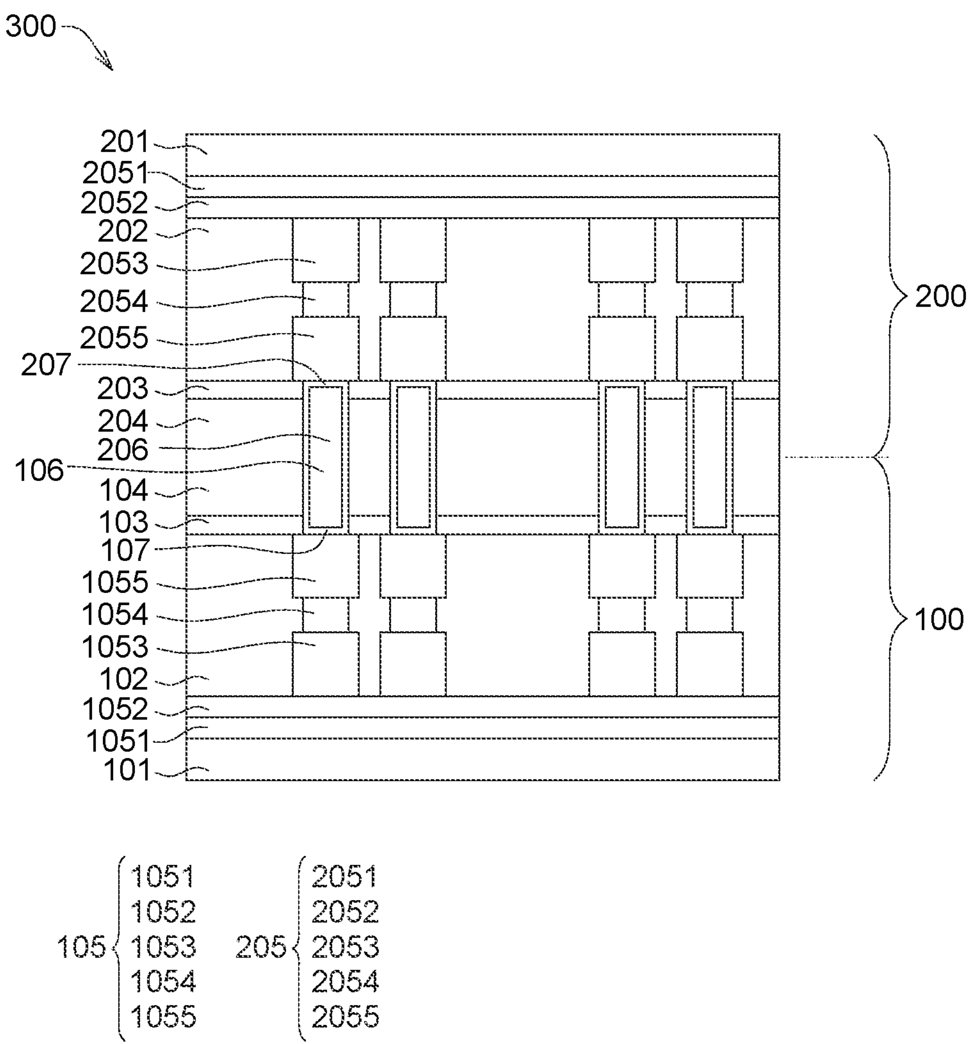
FIG. 2A illustrates a schematic view of a bonding region in a semiconductor device according to an embodiment of the present disclosure.

Referring to FIG. 1 and FIG. 2A. FIG. 2A illustrates a schematic view of a bonding region 300 in a semiconductor device 10 of FIG. 1. The bonding region 300 refers to the bonding joint formed by the semiconductor structure 100 and the semiconductor structure 200 and adjacent areas. The semiconductor structure 100 includes a semiconductor layer 101, a conductive structure 105, an oxide layer 102, a dielectric block layer 103, an oxide layer 104, a bonding pad 106 and a barrier film 107. The conductive structure 105 is on the semiconductor layer 101. The conductive structure 105 may have a multilayer structure. In this embodiment, the conductive structure 105 includes a conductive layer 1051, a conductive layer 1052, a conductive layer 1053, a via 1054 and a redistribution layer 1055. The conductive layer 1051 is on the semiconductor layer 101. The conductive layer 1052 is on the conductive layer 1051. The conductive layer 1052 and the semiconductor layer 101 are on opposite sides of the conductive layer 1051. The conductive layer 1053 is on the conductive layer 1052. The via 1054 is on the conductive layer 1053. The redistribution layer 1055 is on the via 1054. The via 1054 is between the redistribution layer 1055 and the conductive layer 1053. The conductive layer 1053, the via 1054 and the redistribution layer 1055 are in the oxide layer 102. The conductive layer 1051 and the conductive layer 1052 are between the oxide layer 102 and the semiconductor layer 101. In an embodiment, the conductive layer 1051, the conductive layer 1052 and the conductive layer 1053 are metal layers (M1, M2 and M3). The dielectric block layer 103 is on the conductive structure 105 and the oxide layer 102. The oxide layer 104 is on the dielectric block layer 103. The bonding pad 106 passes through the dielectric block layer 103 and the oxide layer 104. The bonding pad 106 is on the conductive structure 105. The barrier film 107 is on the outer surface of the bonding pad 106. The bonding pad 106 is electrically connected to the conductive structure 105 through the barrier film 107. The active surface 100A of the semiconductor structure 100 may include the oxide layer 104, the bonding pad 106 and the barrier film 107.

The semiconductor structure 200 includes a semiconductor layer 201, a conductive structure 205, an oxide layer 202, a dielectric block layer 203, an oxide layer 204, a bonding pad 206 and a barrier film 207. The conductive structure 205 is on the semiconductor layer 201. The conductive structure 205 may have a multilayer structure. In this embodiment, the conductive structure 205 includes a conductive layer 2051, a conductive layer 2052, a conductive layer 2053, a via 2054 and a redistribution layer 2055. The conductive layer 2051 is on the semiconductor layer 201. The conductive layer 2052 is on the conductive layer 2051. The conductive layer 2052 and the semiconductor layer 201 are on opposite sides of the conductive layer 2051. The conductive layer 2053 is on the conductive layer 2052. The via 2054 is on the conductive layer 2053. The redistribution layer 2055 is on the via 2054. The via 2054 is between the redistribution layer 2055 and the conductive layer 2053. The conductive layer 2053, the via 2054 and the redistribution layer 2055 are in the oxide layer 202. The conductive layer 2051 and the conductive layer 2052 are between the oxide layer 202 and the semiconductor layer 201. In an embodiment, the conductive layer 2051, the conductive layer 2052 and the conductive layer 2053 are metal layers (M1, M2 and M3). The dielectric block layer 203 is on the conductive structure 205 and the oxide layer 202. The oxide layer 204 is on the dielectric block layer 203. The bonding pad 206 passes through the dielectric block layer 203 and the oxide layer 204. The bonding pad 206 is on the conductive structure 205. The barrier film 207 is on the outer surface of the bonding pad 206. The bonding pad 206 is electrically connected to the conductive structure 205 through the barrier film 207. The conductive structure 105, the bonding pad 106, the conductive structure 205 and the bonding pad 206 are between the semiconductor layer 101 and the semiconductor layer 201. The active surface 200A of the semiconductor structure 200 may include the oxide layer 204, the bonding pad 206 and the barrier film 207. In this embodiment, the oxide layer 104 of the semiconductor structure 100 is bonded to the oxide layer 204 of the semiconductor structure 200, and the bonding pad 106 of the semiconductor structure 100 is bonded to the bonding pad 206 of the semiconductor structure 200. The conductive structure 105, the bonding pad 106, the conductive structure 205 and the bonding pad 206 are electrically connected to each other.

Figure 2B:
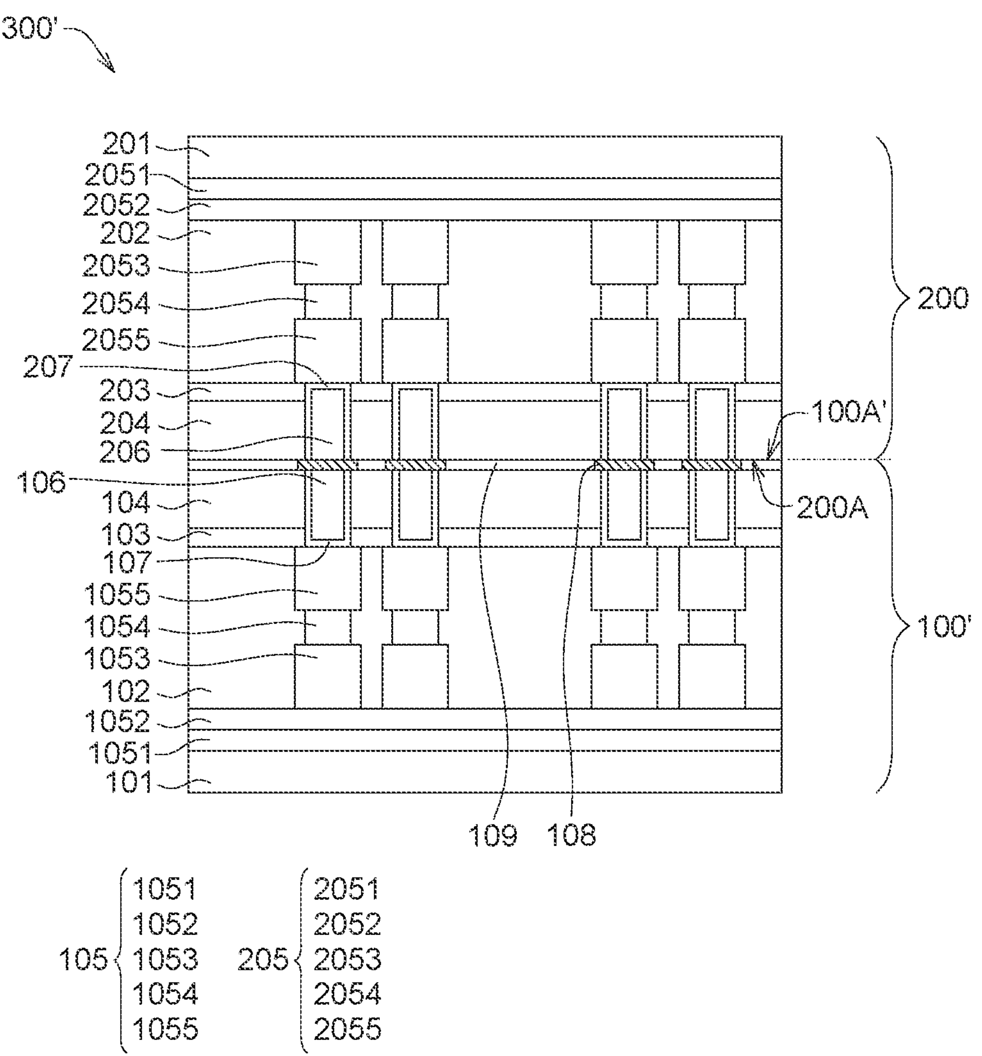
FIG. 2B illustrates a schematic view of a bonding region in a semiconductor device according to an embodiment of the present disclosure.

In other embodiments, the bonding region in the semiconductor device is not limited to the configuration shown in FIG. 2A. FIG. 2B shows another configuration of bonding region which can be used in the present disclosure. Elements in FIG. 2B that are the same as those in FIG. 2A are denoted by the same reference signs, and the descriptions for these elements are shown in previous paragraphs. In bonding region 300' of FIG. 2B, the semiconductor structure 100' includes a conductive portion 108 and an oxide film 109. The oxide film 109 is on the oxide layer 104. The conductive portion 108 is on the bonding pad 106 and in the oxide film 109. The conductive structure 105, the barrier film 107, the bonding pad 106 and the conductive portion 108 of the semiconductor structure 100' are electrically connected to each other. The active surface 100A' of the semiconductor structure 100' includes the conductive portion 108 and the oxide film 109. In this embodiment, the oxide film 109 of the semiconductor structure 100' is bonded to the oxide layer 204 of the semiconductor structure 200, and the conductive portion 108 of the semiconductor structure 100' is bonded to the bonding pad 206 of the semiconductor structure 200. The conductive structure 105, the bonding pad 106, the conductive portion 108, the bonding pad 206 and the conductive structure 205 are electrically connected to each other.

FIGS. 2A-2B merely shows the configurations of the bonding regions in the semiconductor devices; however, the semiconductor structure 100, the semiconductor structure 100' and the semiconductor structure 200 may further include other elements. For example, the semiconductor structure 100, the semiconductor structure 100' and the semiconductor structure 200 may include memory structures such as NOR flash memories, NAND flash memories or other types of memories. In the case of the semiconductor structure 100/100' including memory structures, the memory cells of the memory structures may be below the semiconductor layer 101 (i.e. memory cells and the conductive structure 105 are on opposite sides of the semiconductor layer 101) or between the semiconductor 101 and the conductive structure 105, and the memory cells are electrically connected to the conductive structure 105. In the case of the semiconductor structure 200 including a memory structure, the memory cells of the memory structure may be above the semiconductor layer 201 (i.e. memory cells and the conductive structure 205 are on opposite sides of the semiconductor layer 201) or between the semiconductor 201 and the conductive structure 205, and the memory cells are electrically connected to the conductive structure 205.

FIGS. 3-14 schematically illustrate a method for forming a semiconductor device according to an embodiment of the present disclosure.

Figure 3:
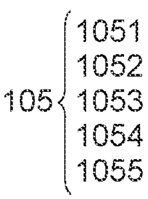
FIGS. 3-14 schematically illustrate a method for forming a semiconductor device according to an embodiment of the present disclosure.
Figure 3:
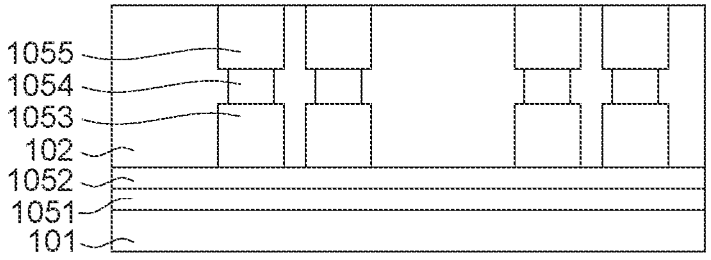

Referring to FIG. 3. An oxide layer 102 and a conductive structure 105 are formed on the semiconductor layer 101. The conductive structure 105 includes a conductive layer 1051, a conductive layer 1052, a conductive layer 1053, a via 1054 and a redistribution layer 1055. The semiconductor layer 101 may include a semiconductor material such as silicon. The oxide layer 102 may include oxide such as silicon oxide. The conductive layer 1051, the conductive layer 1052 and the conductive layer 1053 may include the same material or different materials. For example, the conductive layer 1051, the conductive layer 1052 and the conductive layer 1053 may include metal materials, metalloid materials, semiconductor materials, or a combination of these materials. In an embodiment, the conductive layer 1051, the conductive layer 1052 and the conductive layer 1053 may include tungsten, aluminum, copper, titanium nitride, tantalum nitride, tungsten nitride, doped or undoped polysilicon, cobalt silicide (CoSi), tungsten silicide (WSi) or other suitable conductive materials. The via 1054 may include tungsten. The redistribution layer 1055 may include a conductive material such as copper.

Figure 4:
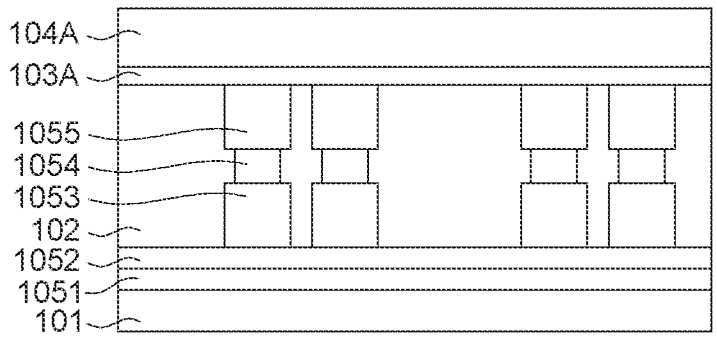

Referring to FIG. 4. A dielectric block layer 103A and an oxide layer 104A are formed. In an embodiment, the dielectric block layer 103A may be formed on the redistribution layer 1055 and the oxide layer 102, and the oxide layer 104A may be formed on the dielectric block layer 103A by deposition processes such as chemical vapor deposition (CVD) processes. The dielectric block layer 103A provides diffusion protection such that the material (e.g. copper) of the redistribution layer 1055 does not diffuse into the oxide layer 104A. The dielectric block layer 103A includes a dielectric material that can provide diffusion protection such as silicon nitride (SiN), silicon carbide (SiC), silicon carbide nitride (SiCN), aluminum nitride (AlN), silicon oxynitride (SiON), etc. The oxide layer 104A may include oxide such as silicon oxide. A thickness of the dielectric block layer 103A along a longitudinal direction is between 200 Å and 2000 Å. A thickness of the oxide layer 104A along the longitudinal direction is between 1000 Å and 20000 Å.

Figure 5:
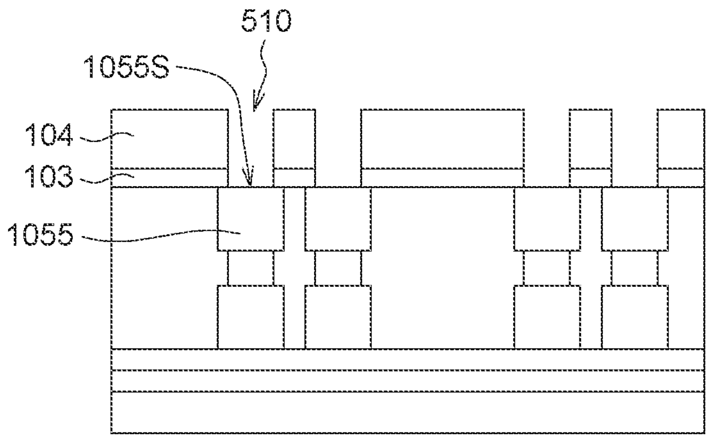

Referring to FIG. 5. Holes 510 are formed. In an embodiment, the holes 510 may be formed by applying an etching process, such as a wet etching process or a dry etching process, to remove a portion of the dielectric block layer 103A and a portion of the oxide layer 104A. The portion of the dielectric block layer 103A remained in this step is the dielectric block layer 103. The portion of the oxide layer 104A remained in this step is the oxide layer 104. The position of the hole 510 may correspond to the position of the redistribution layer 1055, that is, the hole 510 at least partially overlaps the redistribution layer 1055 in the longitudinal direction. The etching process used to form holes 510 may be stopped at the redistribution layer 1055. The upper surface 1055S of the redistribution layer 1055, the sidewall of the dielectric block layer 103, and the sidewall of the oxide layer 104 are exposed in the hole 510.

Figure 6:
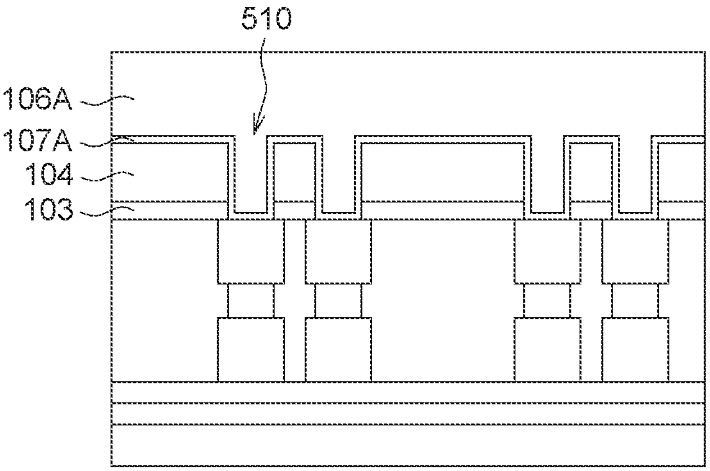

Referring to FIG. 6. A barrier film 107A and a bonding pad material layer 106A are formed. In an embodiment, the barrier film 107A may be formed on the oxide layer 104 and in the holes 510 by a deposition process such as a chemical vapor deposition process, and the barrier film 107A may be formed along the sidewalls and bottoms of the holes 510; then, the bonding pad material layer 106A fills the remaining space of the holes 510 and is formed on the barrier film 107A by a deposition process such as a chemical vapor deposition process. The bonding pad material layer 106A may include copper. The barrier film 107A may include a metal barrier material such as titanium nitride (TiN), tantalum (Ta), cobalt (Co), titanium (Ti), tantalum nitride (TaN), silicon (Si), manganese (Mn), hafnium (Hf), etc.

Figure 7:
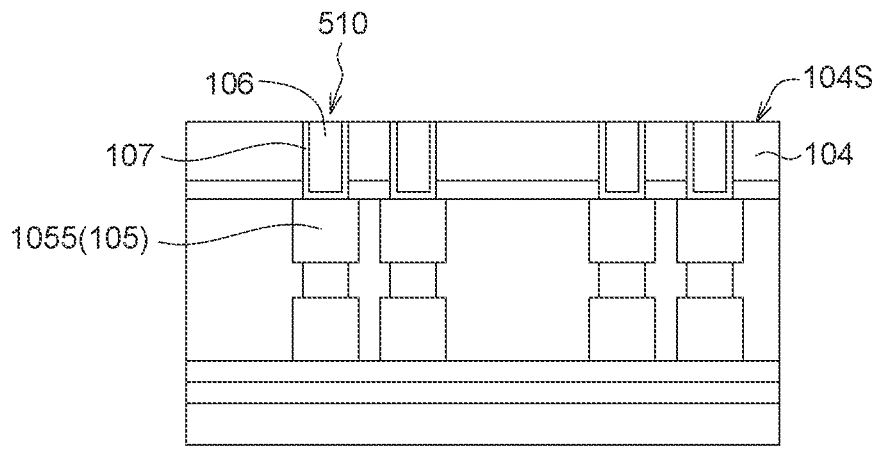

Referring to FIG. 7. A barrier film 107 and bonding pads 106 are formed in the holes 510. In an embodiment, a portion of the barrier film 107A above the upper surface 104S of the oxide layer 104 and a portion of the bonding pad material layer 106A above the upper surface 104S of the oxide layer 104 are removed by a chemical-mechanical planarization (CMP) process or other suitable etching processes, and a portion of the barrier film 107A in the holes 510 and a portion of the bonding pad material layer 106A in the holes 510 are remained. The portion of the barrier film 107A in the holes 510 is the barrier film 107. The portion of the bonding pad material layer 106A in the holes 510 is the bonding pad 106. The bonding pad 106 is formed in the oxide layer 104. The bonding pad 106 is formed on the redistribution layer 1055 of the conductive structure 105.

Figure 8:
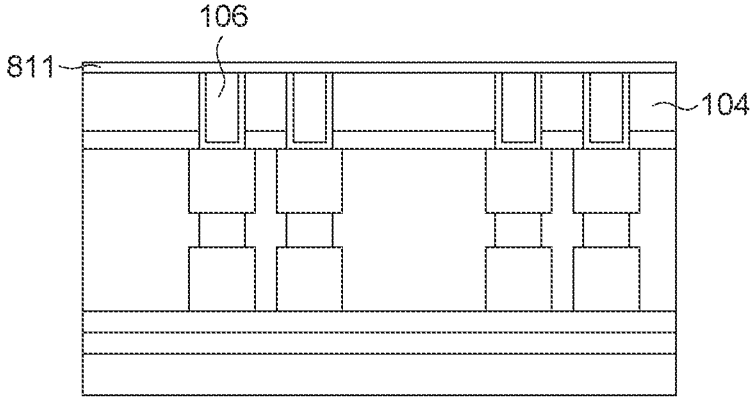

Referring to FIG. 8. An adhesion layer 811 is formed. In an embodiment, the adhesion layer 811 is formed on the bonding pad 106 and the oxide layer 104 by a deposition process such as a chemical vapor deposition process. The adhesion layer 811 may include titanium (Ti), titanium nitride (TiN), tantalum (Ta), tantalum nitride (TaN), cobalt (Co), molybdenum (Mo), chromium (Cr), manganese (Mn), silicon (Si) etc. A thickness of the adhesion layer 811 along the longitudinal direction is between 20 Å and 500 Å.

Figure 9:
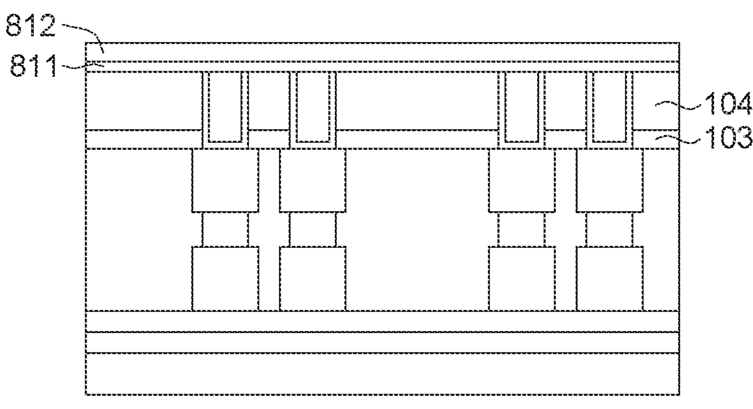

Referring to FIG. 9. A dielectric block layer 812 is formed. In an embodiment, the dielectric block layer 812 is formed on the adhesion layer 811 by a deposition process such as a chemical vapor deposition process. The dielectric block layer 812 may include a dielectric material such as silicon nitride (SiN), silicon carbide (SiC), silicon carbide nitride (SiCN), aluminum nitride (AlN), silicon oxynitride (SiON), etc. The dielectric block layer 103 and the dielectric block layer 812 may include the same material or different materials. A thickness of the dielectric block layer 812 along the longitudinal direction is between 200 Å and 1000 Å.

Figure 10:
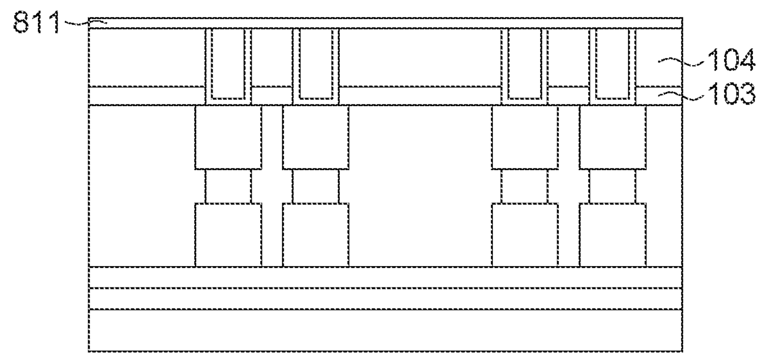

Referring to FIG. 10. The dielectric block layer 812 is removed. In an embodiment, the dielectric block layer 812 is removed by an etching process, such as a wet etching process or a dry etching process. The etching process used to remove the dielectric block layer 812 may be stopped at the adhesion layer 811. In an embodiment, the adhesion layer 811 is used as an etching stop layer. In the steps shown in FIGS. 9-10, the formation and removing of the dielectric block layer 812 may result in alignment pattern signals in the semiconductor structure; the alignment pattern signals can improve the accuracy of the device position in the subsequent process, and thus the reliability of the product can be improved.

Figure 11:
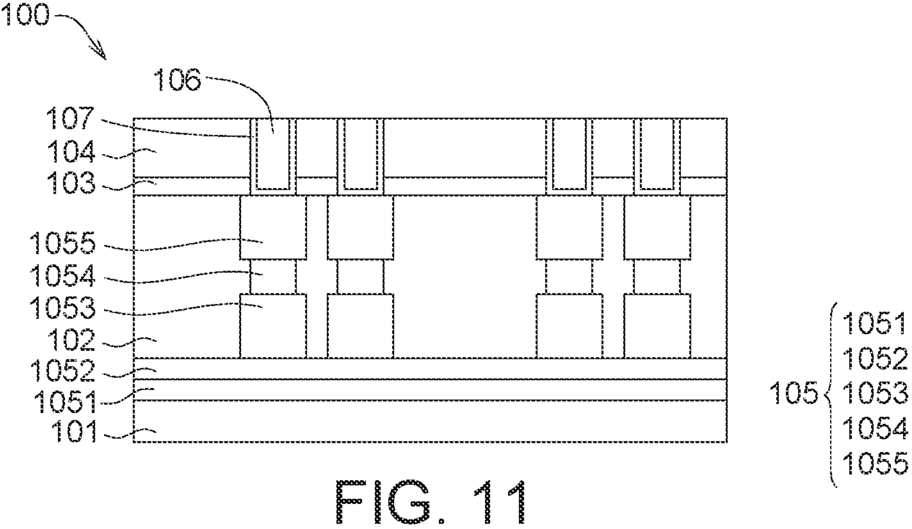

Referring to FIG. 11. The adhesion layer 811 is removed. In an embodiment, the adhesion layer 811 is removed by a chemical-mechanical planarization process, a wet etching process or a dry etching process. In an embodiment, after the adhesion layer 811 is removed, there is still a small amount of components from the adhesion layer 811 remaining on the surfaces of the oxide layer 104 and the bonding pad 106; for example a small amount of titanium may remain on the surfaces of the oxide layer 104 and the bonding pad 106. In an embodiment, after the adhesion layer 811 is removed, no components from the adhesion layer 811 remain on the surfaces of the oxide layer 104 and the bonding pad 106. In an embodiment, a semiconductor structure 100 may be provided through the method schematically illustrated in FIGS. 3-11.

Figure 12:
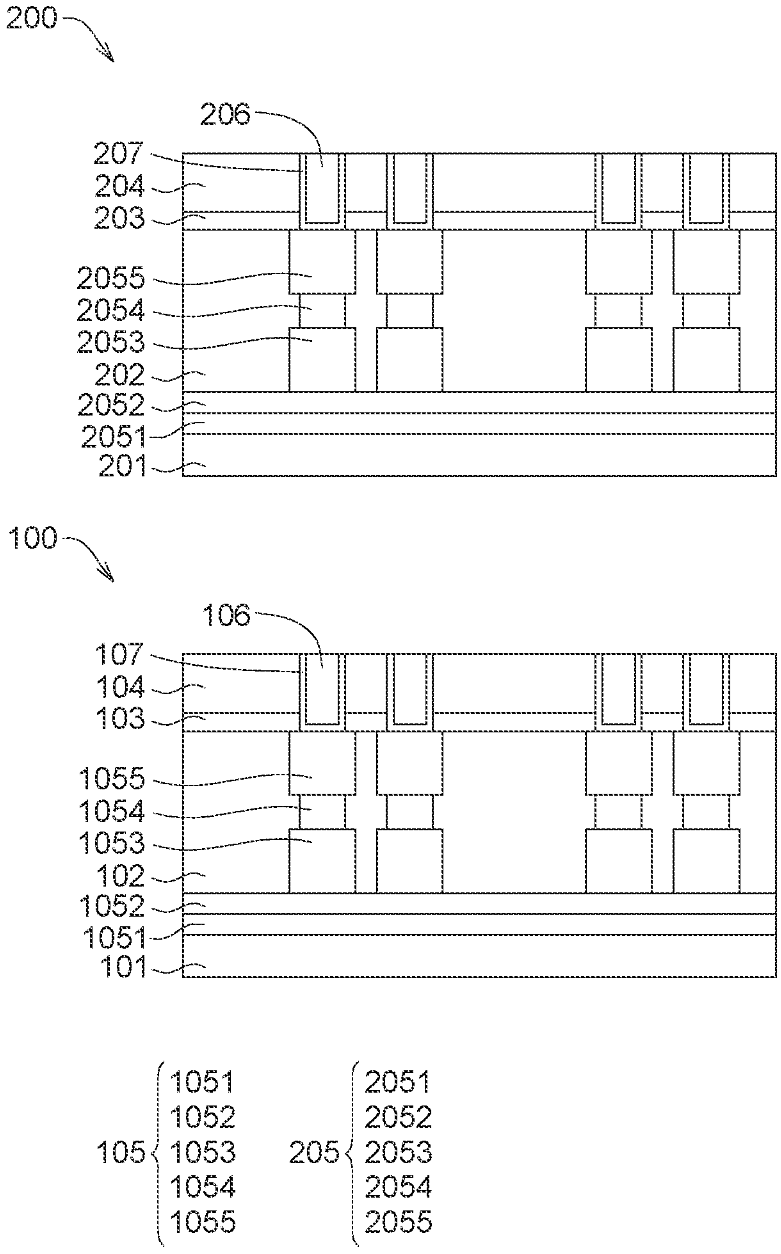

Referring to FIG. 12. A semiconductor structure 200 is formed. The steps for forming the semiconductor structure 200 may be similar to the steps shown in FIGS. 3-11. In FIG. 12, the semiconductor structure 200 is formed after the semiconductor structure 100, but the present disclosure is not limited thereto. The semiconductor structure 100 and the semiconductor structure 200 may be formed simultaneously before bonding, or one of the semiconductor structure 100 and the semiconductor structure 200 may be formed first and then the other of the semiconductor structure 100 and the semiconductor structure 200 may be formed before bonding.

Figure 13:
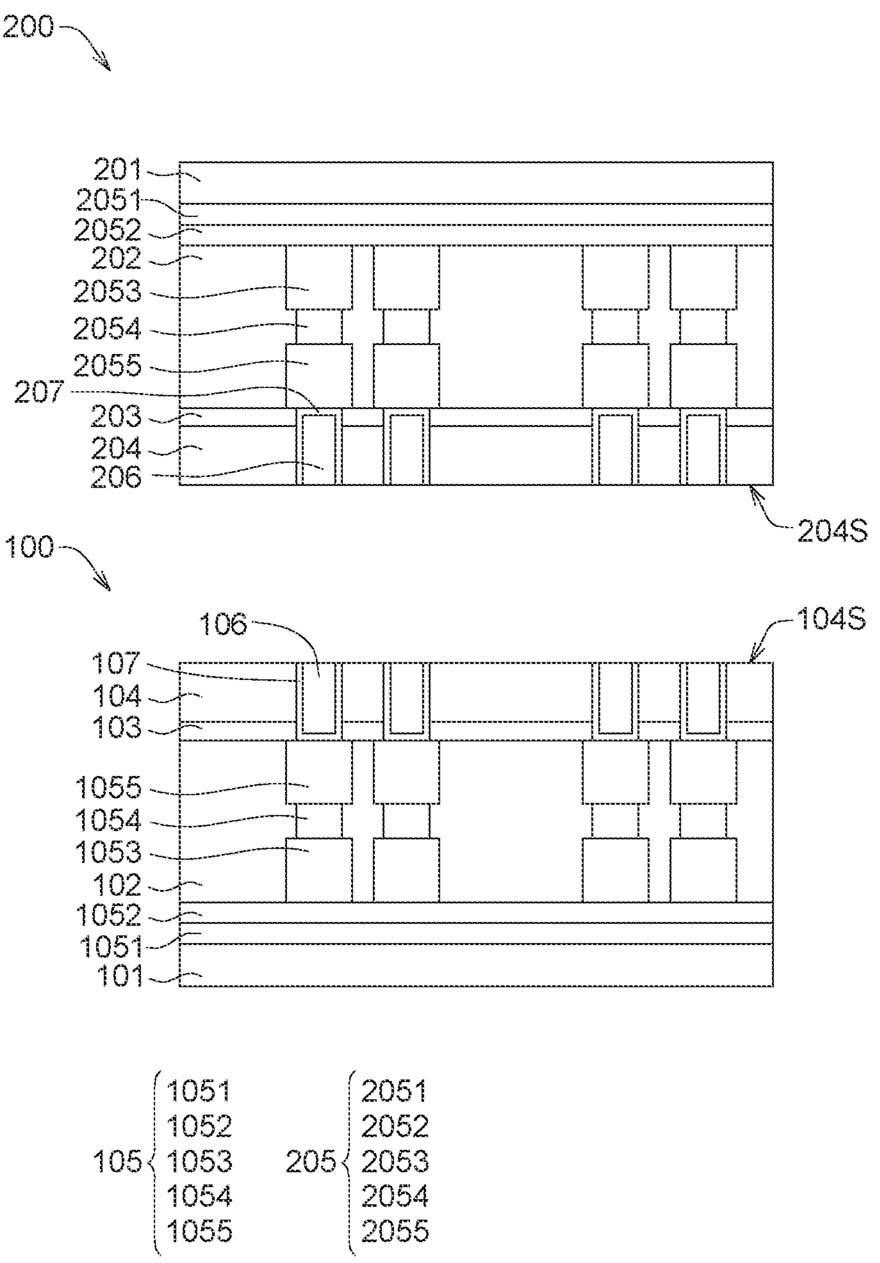
Figure 14:
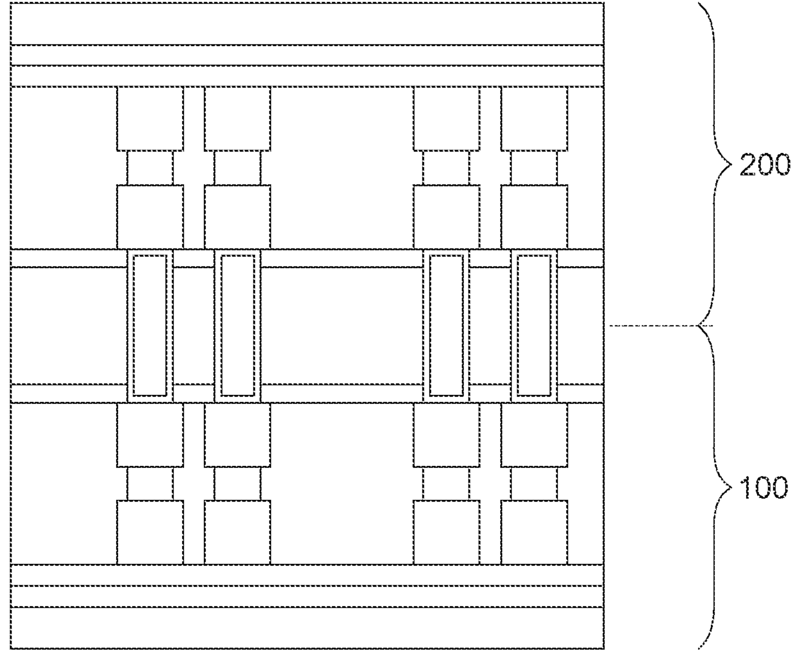

Referring to FIGS. 13-14. The semiconductor structure 100 and the semiconductor structure 200 are oriented such that the upper surface 104S of the oxide layer 104 of the semiconductor structure 100 faces the upper surface 204S of the oxide layer 204 of the semiconductor structure 200. The bonding pad 106 of the semiconductor structure 100 and the bonding pad 206 of the semiconductor structure 200 are substantially aligned in the longitudinal direction. A force, for example, a force in the longitudinal direction, is applied to the semiconductor structure 100 and the semiconductor structure 200 such that the semiconductor structure 100 is bonded to the semiconductor structure 200. For example, the bonding of the semiconductor structure 100 and the semiconductor structure 200 may include bonding the upper surface 104S of the oxide layer 104 of the semiconductor structure 100 to the upper surface 204S of the oxide layer 204 of the semiconductor structure 200, and bonding the bonding pad 106 of the semiconductor structure 100 to the bonding pad 206 of the semiconductor structure 200.

In an embodiment, the method for forming the semiconductor device includes bonding the semiconductor structure 100 to the substrate with the back surface of the semiconductor structure 100 facing the substrate, and performing a wire bonding process to form wires between the substrate and the semiconductor structure 100. In an embodiment, a semiconductor device 10 shown in FIG. 1 and FIG. 2A may be provided through the method schematically illustrated in FIGS. 3-14. In an embodiment, the method for forming the semiconductor device may include: after the upper surface 104S of the oxide layer 104 of the semiconductor structure 100 is in contact with the upper surface 204S of the oxide layer 204 of the semiconductor structure 200 and the bonding pad 106 of the semiconductor structure 100 is in contact with the bonding pad 206 of the semiconductor structure 200, a heating process is performed so that the oxide layer 104 of semiconductor structure 100 and the oxide layer 204 of semiconductor structure 200 are fused to form a continuous structure (or there is no interface between the oxide layer 104 and the oxide layer 204), the barrier film 107 of semiconductor structure 100 and the barrier film 207 of semiconductor structure 200 are fused to form a continuous structure (or there is no interface between the barrier film 107 and the barrier film 207), and/or the bonding pad 106 of semiconductor structure 100 and the bonding pad 206 of semiconductor structure 200 are fused to form a continuous structure (or there is no interface between the bonding pad 106 and the bonding pad 206).

FIGS. 15-18 schematically illustrate a method for forming a semiconductor device according to an embodiment of the present disclosure. In an embodiment, the steps illustrated with referring to FIGS. 15-18 may be performed after the steps illustrated with referring to FIGS. 3-10.

Figure 15:
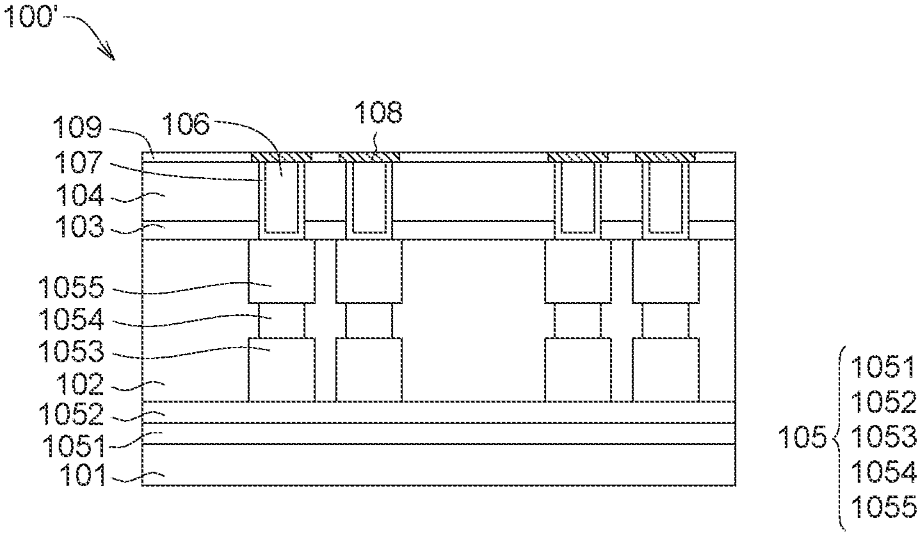
FIGS. 15-18 schematically illustrate a method for forming a semiconductor device according to an embodiment of the present disclosure.

Referring to FIG. 15. A conductive portion 108 and an oxide film 109 are formed. The conductive portion 108 is formed on the oxide film 109. The conductive portion 108 at least partially overlaps the bonding pad 106 in the longitudinal direction.

In an embodiment, an annealing process is performed to the adhesion layer 811 shown in FIG. 10 so that a portion of the adhesion layer 811 above the bonding pad 106 reacts with the bonding pad 106 to form the conductive portion 108, and a portion of the adhesion layer 811 above the oxide layer 104 reacts with the oxide layer 104 to form the oxide film 109. In this embodiment, the conductive portion 108 may include components from the adhesion layer 811 and components from the bonding pad 106, and the oxide film 109 may include components from the adhesion layer 811 and components from the oxide layer 104. The adhesion layer 811 and the oxide film 109 include different materials. The adhesion layer 811 and the conductive portion 108 include different materials. For example, the conductive portion 108 includes MA, M is components from the adhesion layer 811 and includes Titanium (Ti), titanium nitride (TiN), tantalum (Ta), tantalum nitride (TaN), cobalt (Co), molybdenum (Mo), chromium (Cr), manganese (Mn), and silicon (Si), and A is components from the bonding pad 106 (e.g. copper). For example, the oxide film includes MB, M is components from the adhesion layer 811 and includes Titanium (Ti), titanium nitride (TiN), tantalum (Ta), tantalum nitride (TaN), cobalt (Co), molybdenum (Mo), chromium (Cr), manganese (Mn), and silicon (Si), and B is components from the oxide layer 104 (e.g. silicon oxide ($SiO_x$)). For example, in the case where the adhesion layer 811 includes titanium, the oxide layer 104 includes silicon oxide, and the bonding pad 106 includes copper, the conductive portion 108 formed by the annealing process may include TiCu, the oxide film 109 may include $TiSiO_x$, and x is greater than zero.

In other embodiments, an annealing process is performed to the adhesion layer 811 shown in FIG. 10 so that a portion of the adhesion layer 811 above the oxide layer 104 reacts with the oxide layer 104 to form the oxide film 109; a portion of the adhesion layer 811 above the bonding pad 106 does not react with the bonding pad 106 during the annealing process. The portion of the adhesion layer 811 above the bonding pad 106 is the conductive portion 108. In this embodiment, the oxide film 109 may include components from the adhesion layer 811 and components from the oxide layer 104. The adhesion layer 811 and the oxide film 109 include different materials. The adhesion layer 811 and the conductive portion 108 include the same material. For example, in the case where the adhesion layer 811 includes titanium, the oxide layer 104 includes silicon oxide, and the bonding pad 106 includes copper, the conductive portion 108 formed by the annealing process may include Ti, the oxide film 109 may include $TiSiO_x$, and x is greater than zero. In an embodiment, a semiconductor structure 100' may be provided through the method schematically illustrated in FIGS. 3-10 and 15.

Figure 16:
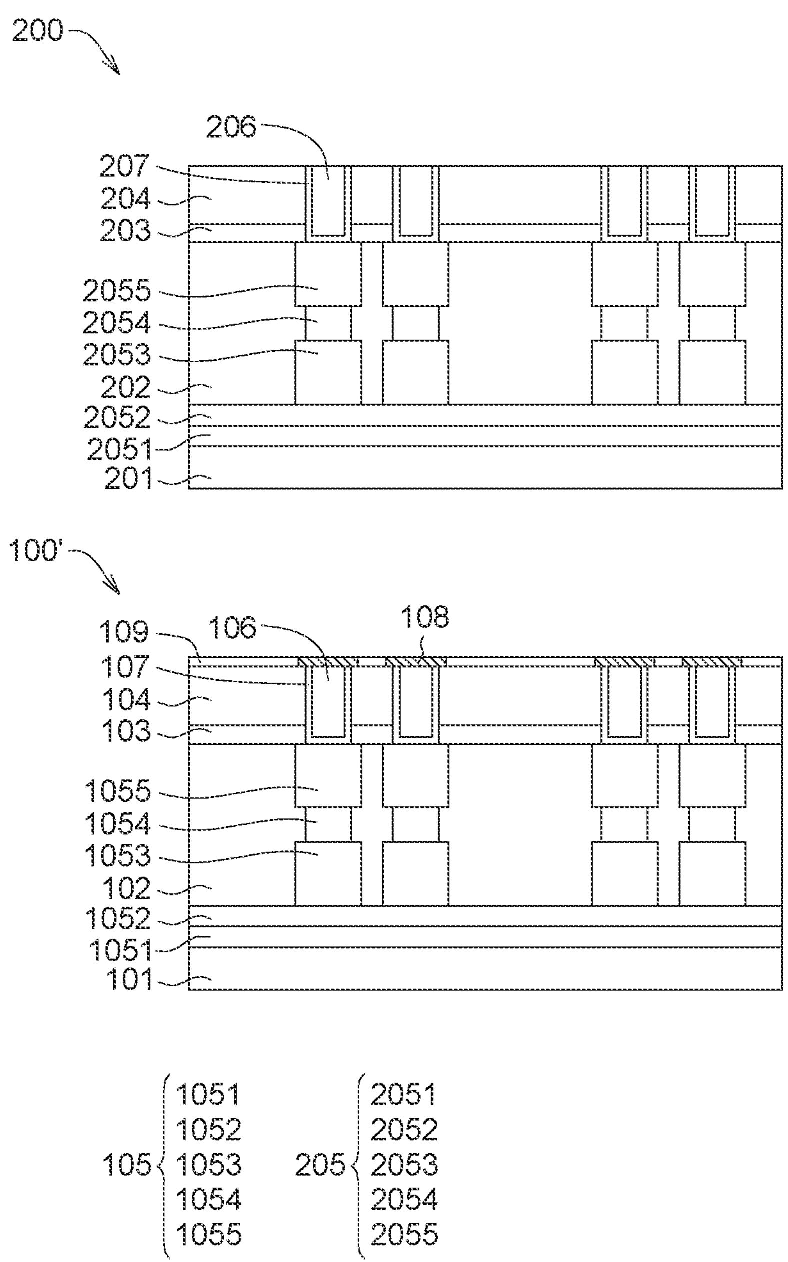

Referring to FIG. 16. A semiconductor structure 200 is formed. The steps for forming the semiconductor structure 200 may be similar to the steps shown in FIGS. 3-11. In FIG. 16, the semiconductor structure 200 is formed after the semiconductor structure 100', but the present disclosure is not limited thereto. The semiconductor structure 100' and the semiconductor structure 200 may be formed simultaneously before bonding, or one of the semiconductor structure 100' and the semiconductor structure 200 may be formed first and then the other of the semiconductor structure 100' and the semiconductor structure 200 may be formed before bonding.

Figure 17:
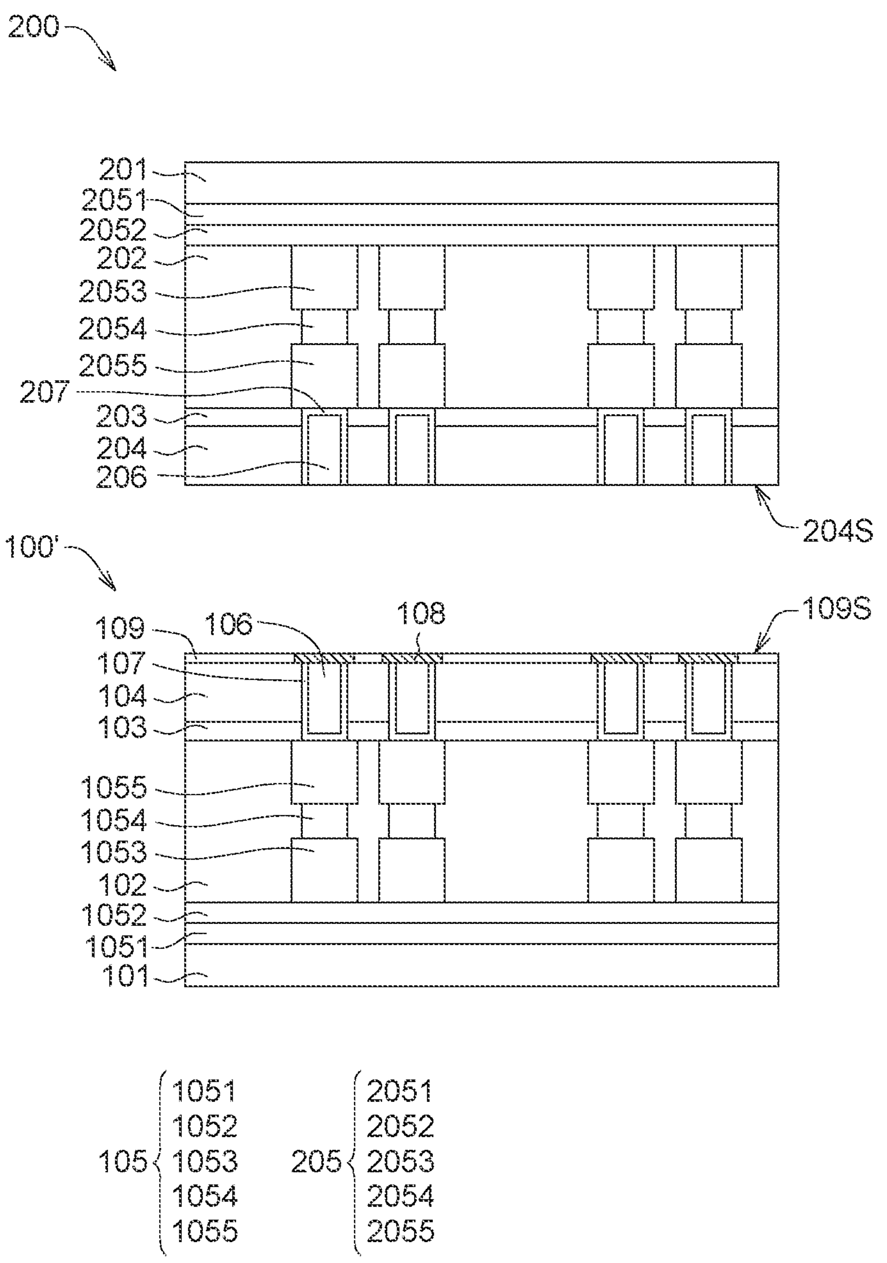
Figure 18:
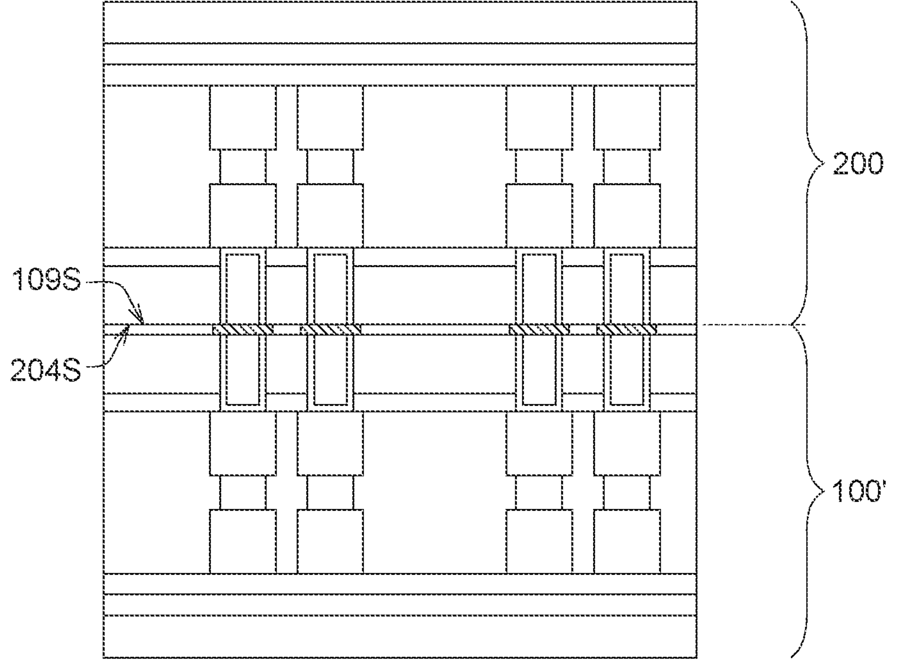

Referring to FIGS. 17-18. The semiconductor structure 100' and the semiconductor structure 200 are oriented such that the upper surface 109S of the oxide film 109 of the semiconductor structure 100' faces the upper surface 204S of the oxide layer 204 of the semiconductor structure 200. The conductive portion 108 of the semiconductor structure 100' and the bonding pad 206 of the semiconductor structure 200 are substantially aligned in the longitudinal direction. A force, for example, a force in the longitudinal direction, is applied to the semiconductor structure 100' and the semiconductor structure 200 such that the semiconductor structure 100' is bonded to the semiconductor structure 200. For example, the bonding of the semiconductor structure 100' and the semiconductor structure 200 may include bonding the upper surface 109S of the oxide film 109 of the semiconductor structure 100' to the upper surface 204S of the oxide layer 204 of the semiconductor structure 200, and bonding the conductive portion 108 of the semiconductor structure 100' to the bonding pad 206 of the semiconductor structure 200. In this embodiment, the conductive portion 108 is between the oxide layer 104 of semiconductor structure 100' and the oxide layer 204 of the semiconductor structure 200, the conductive portion 108 is between the barrier film 107 of semiconductor structure 100' and the barrier film 207 of semiconductor structure 200, and the oxide film 109 is between the bonding pad 106 of semiconductor structure 100' and the bonding pad 206 of semiconductor structure 200, and therefore the oxide layer 104 and the oxide layer 204 are discontinuous structures, the barrier film 107 and the barrier film 207 are discontinuous structures, and the bonding pad 106 and the bonding pad 206 are discontinuous structures.

In an embodiment, the method for forming the semiconductor device includes bonding the semiconductor structure 100' to the substrate with the back surface of the semiconductor structure 100' facing the substrate, and performing a wire bonding process to form wires between the substrate and the semiconductor structure 100'. In an embodiment, a semiconductor device 10 shown in FIG. 1 and FIG. 2B may be provided through the method schematically illustrated in FIGS. 3-10 and 15-18.

In the foregoing embodiments, there is no interface between the semiconductor structure 100 and semiconductor structure 200 after the semiconductor structure 100 is bonded to the semiconductor structure 200; there is an interface between the semiconductor structure 100' and semiconductor structure 200 after the semiconductor structure 100' is bonded to the semiconductor structure 200.

In the semiconductor device of the present disclosure, the first semiconductor structure (e.g. the semiconductor structure 100/100') is bonded to the second semiconductor structure (e.g. the semiconductor structure 200) in a face-to-face bonding arrangement, the footprint of the first semiconductor structure (e.g. the semiconductor structure 100/100') is greater than the footprint of the second semiconductor structure (e.g. the semiconductor structure 200), and the electrical connection of the first semiconductor structure, the second semiconductor structure and the substrate can be achieved through wires coupled between the first semiconductor structure and the substrate. With such configuration, wires coupled between the second semiconductor structure and the substrate can be omitted, the signal transmission distance in the semiconductor device can be reduced, the size of the semiconductor device can be reduced, and the electrical performance of the semiconductor device can be improved. Moreover, the present disclosure provides the adhesion layer between the dielectric block layer and the bonding pad and covering the bonding pad; the configuration of the adhesion layer can improve or avoid the problem of bubbles caused by the stress at the junction of the dielectric block layer and the bonding pad, can improve or avoid the erosion of the bonding pad during removing the dielectric block layer, and can improve or avoid the problem of rough surface of the bonding pad during removing the dielectric block layer. As such, damage to elements in semiconductor device can be avoided, profiles of elements in semiconductor device are in complete shape, and the electrical performance of semiconductor device can be improved.

It is noted that the elements and methods as described above are provided for illustration. The disclosure is not limited to the configurations and procedures disclosed above. Other embodiments with different configurations of known elements can be applicable, and the exemplified elements could be adjusted and changed based on the actual needs of the practical applications. It is, of course, noted that the configurations of figures are depicted only for demonstration, not for limitation. Thus, it is known by people skilled in the art that the related elements and layers in a semiconductor element, the shapes or positional relationship of the elements and the procedure details could be adjusted or changed according to the actual requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:

a substrate;

a first semiconductor structure on the substrate;

a second semiconductor structure on the first semiconductor structure; and a wire coupled between the substrate and the first semiconductor structure, wherein the first semiconductor structure and the second semiconductor structure are electrically connected to the substrate through the wire, wherein a footprint of the first semiconductor structure is greater than a footprint of the second semiconductor structure, the first semiconductor structure comprises an oxide film and a conductive portion in the oxide film, the oxide film and the conductive portion is bonded to the second semiconductor structure, the oxide film and the conductive portion comprise the same type of metal.

2. The semiconductor device according to claim 1, wherein the first semiconductor structure comprises:

a first semiconductor layer;

a first conductive structure on the first semiconductor layer; and a first bonding pad on the first conductive structure and electrically connected to the first conductive structure, wherein the second semiconductor structure comprises:

a second semiconductor layer;

a second conductive structure on the second semiconductor layer; and a second bonding pad on the second conductive structure and electrically connected to the second conductive structure, wherein the first conductive structure, the first bonding pad, the second conductive structure and the second bonding pad are between the first semiconductor layer and the second semiconductor layer.

3. The semiconductor device according to claim 1, wherein the conductive portion comprises Ti, TiN, Ta, TaN, Co, Mo, Cr, Mn or Si.

4. The semiconductor device according to claim 1, wherein the conductive portion comprises MCu, M comprises Ti, TiN, Ta, TaN, Co, Mo, Cr, Mn or Si.

5. The semiconductor device according to claim 1, wherein the oxide film comprises $MSiO_x$, M comprises Ti, TiN, Ta, TaN, Co, Mo, Cr, Mn or Si, and x is greater than zero.

6. The semiconductor device according to claim 1, wherein the first semiconductor structure is bonded to the second semiconductor structure in a face-to-face bonding arrangement.

7. The semiconductor device according to claim 6, wherein the conductive portion comprises Ti or TiCu.

8. The semiconductor device according to claim 1, wherein the first semiconductor structure is a memory chip, and the second semiconductor structure is a memory chip.

9. A semiconductor device, comprising:

a first semiconductor structure having a first active surface; and a second semiconductor structure having a second active surface, wherein the second active surface of the second semiconductor structure faces toward the first active surface of the first semiconductor structure, and the first semiconductor structure is bonded to the second semiconductor structure;

wherein the first active surface of the first semiconductor structure comprises Ti, the first semiconductor structure comprises an oxide film and a conductive portion in the oxide film, the oxide film and the conductive portion is bonded to the second semiconductor structure, the oxide film and the conductive portion comprise the same type of metal.

* * * * *